United States Patent
Cheng et al.

(10) Patent No.: US 12,446,286 B2
(45) Date of Patent: Oct. 14, 2025

(54) SEMICONDUCTOR DEVICE AND MANUFACTURING PROCESS FOR THE SAME

(71) Applicant: WUHAN XINXIN SEMICONDUCTOR MANUFACTURING CO., LTD., Wuhan (CN)

(72) Inventors: Yajie Cheng, Wuhan (CN); Senhua Shi, Wuhan (CN)

(73) Assignee: WUHAN XINXIN SEMICONDUCTOR MANUFACTURING CO., LTD, Wuhan (CN)

( * ) Notice: Subject to any disclaimer, the term of this patent is extended or adjusted under 35 U.S.C. 154(b) by 379 days.

(21) Appl. No.: 18/065,627

(22) Filed: Dec. 14, 2022

(65) Prior Publication Data

US 2023/0238435 A1    Jul. 27, 2023

(30) Foreign Application Priority Data

Jan. 27, 2022    (CN) .......................... 202210101346.5

(51) Int. Cl.
  *H01L 29/40* (2006.01)
  *H01L 21/3215* (2006.01)
  (Continued)

(52) U.S. Cl.
  CPC ..... *H10D 64/112* (2025.01); *H01L 21/32155* (2013.01); *H10D 30/0281* (2025.01);
  (Continued)

(58) Field of Classification Search
  CPC .. H10D 64/112; H10D 30/0281; H10D 30/65; H10D 62/154; H10D 62/158;
  (Continued)

(56) References Cited

U.S. PATENT DOCUMENTS

| | | | |
|---|---|---|---|
| 2007/0029587 A1 | 2/2007 | Greer et al. | |
| 2013/0181286 A1 | 7/2013 | Zhang et al. | |

(Continued)

FOREIGN PATENT DOCUMENTS

| | | | |
|---|---|---|---|
| CN | 102097471 A | 6/2011 | |
| CN | 103035730 A | 4/2013 | |

OTHER PUBLICATIONS

Chinese First Office Action, Chinese Application No. 202210101346. 5, mailed May 31, 2024 (9 pages).

*Primary Examiner* — Mohammed R Alam

(57) ABSTRACT

A semiconductor device includes: a semiconductor substrate, a gate oxide layer, and a polysilicon field plate. The semiconductor substrate includes a drift region and a well region. An end of the drift region is arranged with a drain region, and an end of the well region is arranged with a source region. The gate oxide layer is arranged on the semiconductor substrate and disposed between the source region and the drain region. The polysilicon field plate is arranged on the gate oxide layer. At least a portion of the polysilicon field plate is projected onto the drift region and includes at least two field-plate regions. While the semiconductor device is operating, in a direction from an end of the drift region near the well region approaching the drain region, an equivalent electrical thickness of an insulating layer between the polysilicon field plate and the drift region gradually increases.

20 Claims, 4 Drawing Sheets

(51) Int. Cl.
    *H10D 30/01*     (2025.01)
    *H10D 30/65*     (2025.01)
    *H10D 62/13*     (2025.01)
    *H10D 64/00*     (2025.01)

(52) U.S. Cl.
    CPC ........... *H10D 30/65* (2025.01); *H10D 62/154* (2025.01); *H10D 62/158* (2025.01)

(58) Field of Classification Search
    CPC ............. H10D 30/603; H10D 30/0221; H10D 64/111; H10D 64/516; H10D 64/671; H10D 64/519; H01L 21/32155
    See application file for complete search history.

(56) References Cited

U.S. PATENT DOCUMENTS

| | | | |
|---|---|---|---|
| 2014/0175542 A1 | 6/2014 | Jang et al. | |
| 2016/0005858 A1* | 1/2016 | Ma ....................... | H10D 30/603 257/493 |
| 2022/0393027 A1* | 12/2022 | Koshimizu .......... | H10D 84/153 |

\* cited by examiner

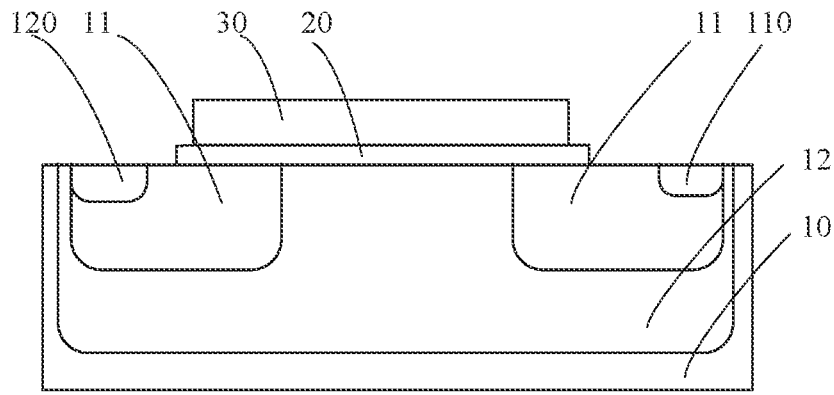

FIG. 10

| Providing a semiconductor substrate. The semiconductor substrate includes a drift region in a first conductive type and a trap region in a second conductive type. An end of the drift region away from the trap region is configured to form a drain region, and an end of the trap region away from the drift region is configured to form a source region | S1 |

↓

| forming a gate oxide layer on the semiconductor substrate | S2 |

↓

| In an operation S3, forming a polysilicon gate on the gate oxide layer, and performing an ion doping process on at least a portion of the polysilicon gate, allowing the portion of the polysilicon gate to be projected onto the drift region, wherein the portion of the polysilicon gate includes a doped polysilicon gate region and a non-doped polysilicon gate region | S3 |

FIG. 11

SEMICONDUCTOR DEVICE AND MANUFACTURING PROCESS FOR THE SAME

CROSS REFERENCE TO RELATED APPLICATIONS

The present application claims the priority of the Chinese patent application No. 202210101346.5, filed on Jan. 27, 2022, and the contents of which are incorporated herein by its entireties.

TECHNICAL FIELD

The present disclosure relates to the field of semiconductors, and in particular to a diffusion-type semiconductor device and a manufacturing process of the diffusion-type semiconductor device.

BACKGROUND

Diffusion-type semiconductor devices may be commonly configured in radio frequency circuits to achieve power controlling. Commonly used diffusion-type semiconductor devices may include a laterally diffused metal oxide semiconductor (LDMOS) transistor and a double diffused drain metal oxide semiconductor (DDDMOS) transistor, which may provide high breakdown voltage and have low on-resistance while operating.

In detail, a diffusion-type semiconductor device may usually include a semiconductor substrate and a gate oxide layer, and a polysilicon gate, wherein the gate oxide layer and the polysilicon gate may be laminated and arranged above the semiconductor substrate. The semiconductor substrate includes a drift region and a well region. A source region may be arranged on the well region, and a drain region may be arranged on the drift region. By providing the gate oxide layer and the polysilicon gate on the well region and the drift region, a depletion electric field in the drift region at a blocked state may be weakened, and the breakdown voltage may be increased.

During operation, the polysilicon gate on the drift region, the drift region, and the gate oxide layer disposed there between may cooperatively form a field plate capacitor. In order to increase the breakdown voltage, in a direction from the well region approaching an edge of the drift region and further approaching the drain region, a capacitance value of the field plate capacitor gradually decreases in order to improve electrical performance of the semiconductor device. In order to achieve a gradual change in the capacitance value of the field plate capacitor, the gate oxide layer arranged on the drift region may usually be configured as a step. That is, an equivalent electrical thickness of an insulating layer in the field plate capacitor may be changed, such that a gradual change in the capacitance value of the field plate capacitor may be achieved.

Although the gate oxide layer is configured to have an increased number of steps to allow the capacitance value of the field plate capacitor to vary almost linearly, the increased number of steps indicates that an increased number of manufacturing processes may be performed, and higher costs are generated, and mass manufacturing may not be easily achieved.

SUMMARY OF THE DISCLOSURE

According to the present disclosure, a semiconductor device and a manufacturing process of the semiconductor device are provided to improve performance of the semiconductor device.

According to an aspect, a semiconductor device is provided and includes: a semiconductor substrate, comprising a drift region in a first conductivity type and a well region in a second conductivity type, wherein an end of the drift region away from the well region is arranged with a drain region, and an end of the well region away from the drift region is arranged with a source region; a gate oxide layer, arranged on the semiconductor substrate and disposed between the source region and the drain region; and a polysilicon gate, arranged on the gate oxide layer. At least a portion of the polysilicon gate is projected onto the drift region, and the portion of the polysilicon gate that is projected onto the drift region comprises at least two gate regions having different doping concentrations; and while the semiconductor device is operating, in a direction from an end of the drift region near the well region approaching the drain region, an equivalent electrical thickness of an insulating layer disposed in a field plate capacitor, which is formed by the portion of the polysilicon gate projected onto the drift region and the drift region, gradually increases.

According to another aspect of the present disclosure, a manufacturing process of a semiconductor device is provided and includes: providing a semiconductor substrate, wherein the semiconductor substrate includes a drift region in a first conductive type and a well region in a second conductive type, an end of the drift region away from the well region is configured to form a drain region, and an end of the well region away from the drift region is configured to form a source region; forming a gate oxide layer on the semiconductor substrate; and forming a polysilicon gate on the gate oxide layer, and performing an ion doping process on at least a portion of the polysilicon gate to allow the portion of the polysilicon gate projected onto the drift region to comprise at least two gate regions having different doping concentrations. While the semiconductor device is operating, in a direction from an end of the drift region near the well region approaching the drain region, an equivalent electrical thickness of an insulating layer disposed in a field plate capacitor, which is formed between the portion of the polysilicon gate projected onto the drift region and the drift region increases.

BRIEF DESCRIPTION OF THE DRAWINGS

FIG. 10 is a cross sectional view of a semiconductor device according to another embodiment of the present disclosure.

FIG. 11 is a flow chart of a manufacturing process of a semiconductor device according to an embodiment of the present disclosure.

DETAILED DESCRIPTION

Technical solutions in the embodiments of the present disclosure will be clearly and completely described below by referring to the accompanying drawings in the embodiments of the present disclosure. Obviously, the embodiments described are only a part of but not all of the embodiments of the present disclosure. Based on the embodiments of the present disclosure, all other embodiments obtained by any ordinary skilled person in the art without creative work shall fall within the scope of the present disclosure.

Terms "first", "second" and "third" in the present disclosure are used for descriptive purposes only and shall not be interpreted as indicating or implying relative importance or implicitly specifying the number of indicated technical features. Therefore, a feature defined by the "first", "second" and "third" may explicitly or implicitly include at least one such feature. In the description of the present disclosure, "a plurality of" means at least two, such as two, three, and so on, unless otherwise expressly and specifically limited. All directional indications (such as up, down, left, right, forward, backward . . .) in the present disclosure are used to indicate only relative positions and movements of components at a particular attitude (the attitude shown in a corresponding drawing). When the particular attitude is changed, the directional indications may be changed accordingly. In addition, terms "include", "have", and any variation thereof, may indicate non-exclusive inclusion. For example, a process, a method, a system, a product or an apparatus including a series of operations or units is not limited to the listed operations or units, but may further include operations or units that are not listed, or may further include other operations or units that are inherently included in the process, the method, the product or the apparatus.

"Embodiments" mentioned in the present disclosure may indicate that particular features, structures or properties described by referring to an embodiment may be included in at least one embodiment of the present disclosure. Presence of the term in various sections in the specification does not necessarily mean a same embodiment, nor a separate or an alternative embodiment that is mutually exclusive with other embodiments. It is understood, both explicitly and implicitly, by any ordinary skilled person in the art that the embodiments described herein may be combined with other embodiments.

The present disclosure will be illustrated in detail in the following by referring to the accompanying drawings and embodiments.

Figure 1:
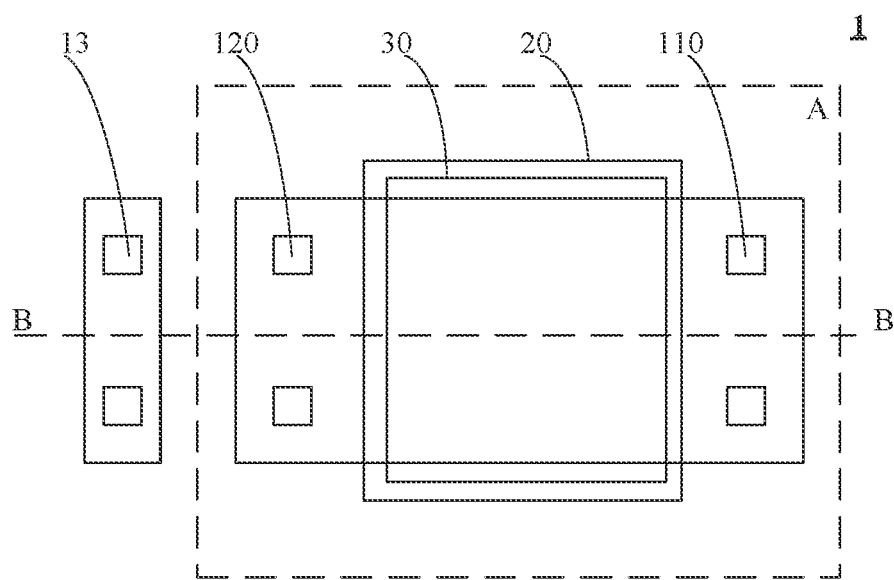
FIG. 1 is a schematic plane view of a semiconductor device according to an embodiment of the present disclosure.
Figure 2:
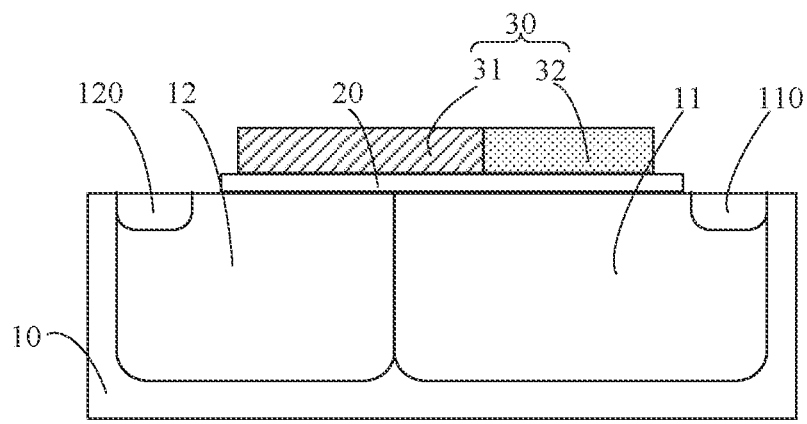
FIG. 2 is a cross sectional view of the semiconductor device shown in FIG. 1, taken along a line B-B, according to a first embodiment of the present disclosure.
Figure 3:
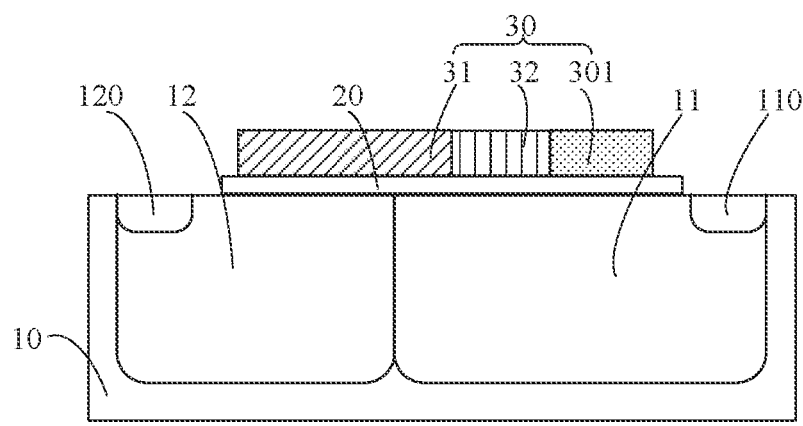
FIG. 3 is a cross sectional view of a semiconductor device, taken along a line B-B, according to an implementation of the first embodiment of the present disclosure.
Figure 4:
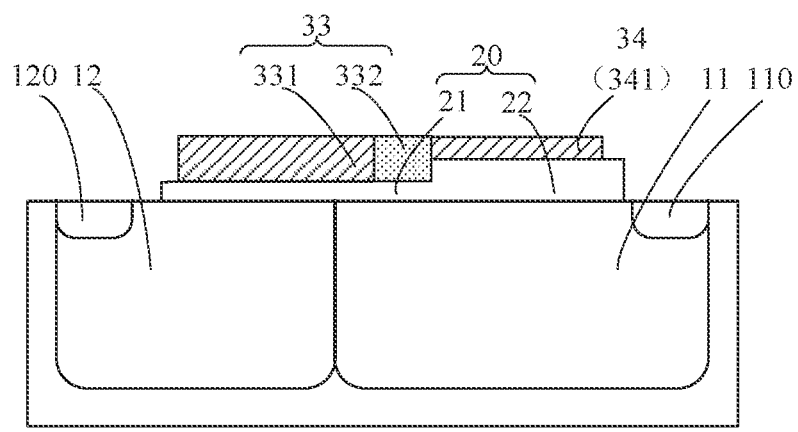
FIG. 4 is a cross sectional view of the semiconductor device shown in FIG. 1, taken along the line B-B, according to a second embodiment of the present disclosure.
Figure 5:
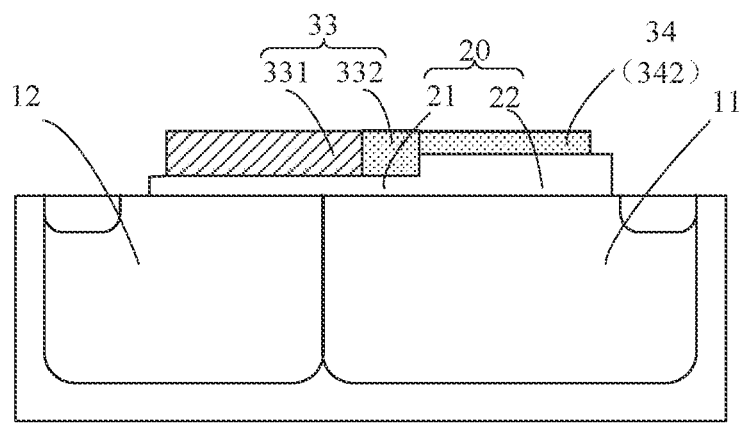
FIG. 5 is a cross sectional view of a semiconductor device, taken along the line B-B, according to an implementation of the second embodiment of the present disclosure.
Figure 6:
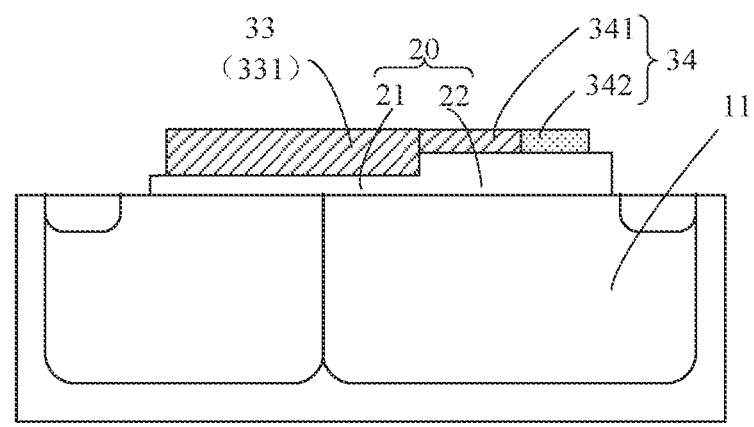
FIG. 6 is a cross sectional view of a semiconductor device, taken along the line B-B, according to another implementation of the second embodiment of the present disclosure.
Figure 7:
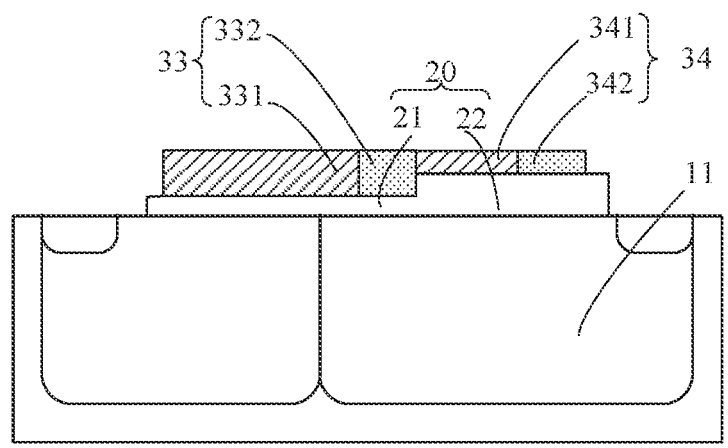
FIG. 7 is a cross sectional view of a semiconductor device, taken along the line B-B, according to still another implementation of the second embodiment of the present disclosure.
Figure 8:
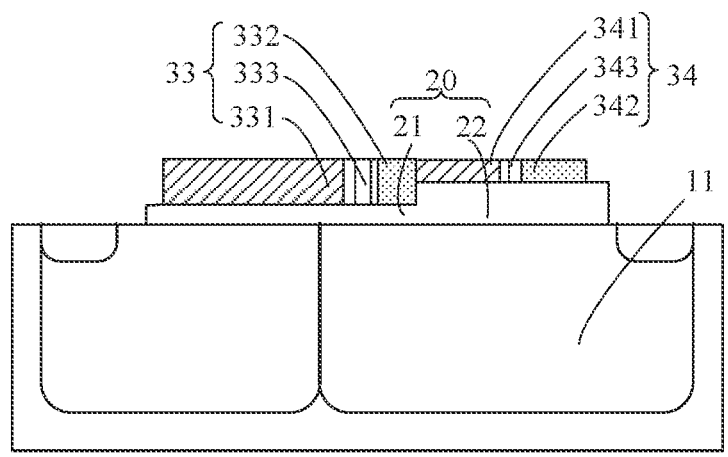
FIG. 8 is a cross sectional view of a semiconductor device, taken along the line B-B, according to still another implementation of the second embodiment of the present disclosure.
Figure 9:
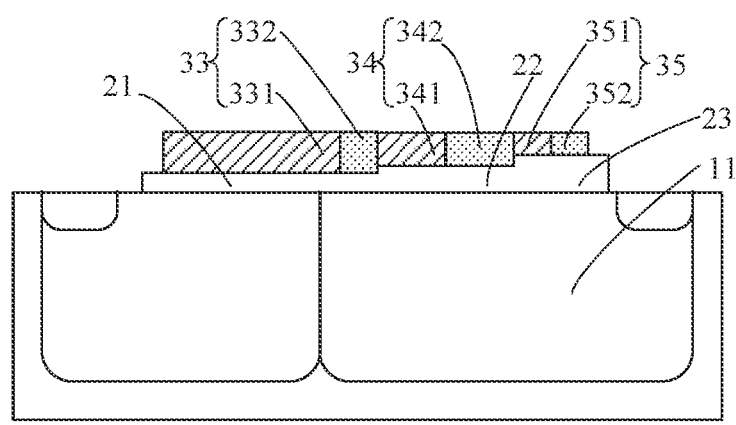
FIG. 9 is a cross sectional view of the semiconductor device shown in FIG. 1, taken along a line B-B, according to a third embodiment of the present disclosure.

As shown in FIGS. 1 to 9, FIG. 1 is a schematic plane view of a semiconductor device according to an embodiment of the present disclosure, FIG. 2 is a cross sectional view of the semiconductor device shown in FIG. 1, taken along a line B-B, according to a first embodiment of the present disclosure, FIG. 3 is a cross sectional view of a semiconductor device, taken along a line B-B, according to an implementation of the first embodiment of the present disclosure, FIG. 4 is a cross sectional view of the semiconductor device shown in FIG. 1, taken along the line B-B, according to a second embodiment of the present disclosure, FIG. 5 is a cross sectional view of a semiconductor device, taken along the line B-B, according to an implementation of the second embodiment of the present disclosure, FIG. 6 is a cross sectional view of a semiconductor device, taken along the line B-B, according to another implementation of the second embodiment of the present disclosure, FIG. 7 is a cross sectional view of a semiconductor device, taken along the line B-B, according to still another implementation of the second embodiment of the present disclosure, FIG. 8 is a cross sectional view of a semiconductor device, taken along the line B-B, according to still another implementation of the second embodiment of the present disclosure, and FIG. 9 is a cross sectional view of the semiconductor device shown in FIG. 1, taken along a line B-B, according to a third embodiment of the present disclosure.

As shown in FIGS. 1 to 9, the present disclosure provides a semiconductor device 1. In the present embodiment, the semiconductor device 1 is an LDMOS transistor, including basic transistor structures, including a source region 120, a polysilicon field plate 30 and a drain region 110. The source region 120 and the drain region 110 may be arranged symmetrically or asymmetrically with each other, and disposed around the polysilicon field plate 30. In addition, the semiconductor device 1 further includes a well lead-out region 13, which is isolated from the source region 120 by an isolation structure.

In detail, the semiconductor device 1 includes a semiconductor substrate 10, a gate oxide layer 20, and a polysilicon field plate 30, which are arranged successively and are laminated.

The semiconductor substrate 10 may be made of silicon, germanium, silicon-germanium, silicon carbide, gallium arsenide, gallium phosphide, indium phosphide, indium arsenide, or indium antimonide, or silicon on insulator (SOI), or germanium on insulator (GOI), or other materials such as GaAs, GaAsP, AlInAs, AlGaAs, GaInAs, GaInP or GaInAsP, or a combination therefore.

The semiconductor substrate 10 includes a drift region 11 in a first conductivity type and a well region 12 in a second conductivity type. An end of the drift region 11 away from the well region 12 is arranged with the drain region 110. An end of the well region 12 away from the drift region 11 is arranged with the source region 120. The "end" may refer to an end portion or a region disposed near the end portion. The semiconductor device 1 may be an n-type device or a p-type device. When the semiconductor device 1 is the n-type device, the first conductivity type is an n-type, and the second conductivity type, which is opposite to the first conductivity type, is a p-type. While the device is operating, the p-type well region 12 is influenced by a voltage applied by the polysilicon field plate 30 to define an n-type channel at a region near the polysilicon field plate 30. When the semiconductor device 1 is the p-type device, the first conductivity type is the p-type, and the second conductivity type, which is opposite to the first conductivity type, is the n-type. While the device is operating, the n-type well region 12 is influenced by the voltage applied by the polysilicon field plate 30 to define a p-type channel at a region near the polysilicon field plate 30. Dopants for the p-type may include phosphorus, arsenic, and so on. Dopants for the p-type may include boron, indium, and so on. In the present disclosure, the semiconductor device 1 in the n-type may be taken as an example for illustration.

The gate oxide layer 20 is arranged on the semiconductor substrate 10, and a projection of the gate oxide layer 20 on the semiconductor substrate 10 is located between the source region 120 and the drain region 110. In detail, a part of the gate oxide layer 20 is disposed on the well region 12, and the rest part of the gate oxide layer 20 extends to be disposed on the drift region 11. The gate oxide layer 20 may include a thermal oxide layer and/or a high temperature deposited oxide layer. A molecular density of the high temperature oxide layer may be greater than a molecular density of the thermal oxide layer, and insulating performance of the high temperature oxide layer may be greater than insulating performance of the thermal oxide layer. Therefore, the high temperature oxide layer may allow a higher breakdown voltage to be achieved. Therefore, any ordinary skilled person in the art shall understand that, while a step-shaped gate oxide layer 20 is being formed, the thermal oxide layer may be firstly formed on the semiconductor substrate 10 by performing a thermal oxidation process, and subsequently, a high temperature deposition process may be performed to form the high temperature deposition oxide layer on a part of the thermal oxide layer at a region of a high electric field density, such that the step-shaped gate oxide layer 20. In some embodiments, the high temperature deposition oxide layer may be firstly formed on the semiconductor substrate 10 by performing the high temperature deposition process. Subsequently, a portion of the high temperature deposition oxide layer is etched away. The etched-away portion of the high temperature deposition oxide layer includes the high temperature deposition oxide layer that is disposed on the well region 12 and a portion of the high temperature deposition oxide layer that is arranged on the drift region 11. Further, the thermal oxide layer is formed on the well region 12 and a part of the drift region 11 by performing the thermal oxidation process, such that the step-shaped gate oxide layer 20 is obtained.

The polysilicon field plate 30 is arranged on the gate oxide layer 20, and at least a portion of the polysilicon field plate 30 is projected onto the drift region 11. While the semiconductor device 1 is operating, the portion of the polysilicon field plate 30 that is projected onto the drift region 11. The drift region 11, and the gate oxide layer 20 disposed between the portion of the polysilicon field plate 30 and the drift region 11 cooperatively form a field plate capacitor. The other part of the polysilicon field plate 30 that is not projected onto the drift region 11 is arranged on the well region 12 and serves as a true gate electrode. When a voltage is applied to the polysilicon field plate 30, the well region 12 is affected by the voltage applied to the other part of the polysilicon field plate 30, which is arranged on the well region 12, and therefore, a channel is defined in a region of the well region 12 near the polysilicon field plate 30.

The portion of the polysilicon field plate 30 projected onto the drift region 11 includes at least two field-plate regions having different doping concentrations. Therefore, while the device is operating, in a direction from the end of the drift region 11 near the well region 12 approaching the drain region 110, an equivalent electrical thickness of the insulating layer the portion of the polysilicon field plate 30 projected onto the drift region 11 and the drift region 11 for forming the field plate capacitor gradually increases, and a capacitance value of the field plate capacitor gradually decreases. In this way, the breakdown voltage of the semiconductor device 1 is increased. In some embodiments, the "gradually increases" may refer to a linear increase, an approximately linear increase, or a stepped increase.

The equivalent electrical thickness of the insulation layer disposed in the field plate capacitor refers to an equivalent thickness of electrical insulation of the insulation layer between two electrode plates of the field plate capacitor. In the present disclosure, since the polysilicon field plate 30 has different doping concentrations, when the voltage is applied to the polysilicon field plate 30, a depletion region may be likely to be formed at a junction between a region of the polysilicon field plate 30 having a lower doping concentration and the gate oxide layer 20, and a thickness of the depletion region may be large. The depletion region may be insulated and may be equivalently served as the equivalent insulation layer disposed between the two electrode plates of the field plate capacitor, such that the equivalent electrical thickness of the insulation layer of the field plate capacitor may be increased. For example, a certain field-plate region in the polysilicon field plate 30 is a region having a doping concentration of 0, i.e., a non-doped field-plate region. A thickness of the polysilicon field plate 30 at this field-plate region is 800 Å, and a dielectric constant is 11.5. In this case, when the voltage is applied to the polysilicon field plate 30, the depletion region is formed at this field-plate region and near the junction between this field-plate region and the gate oxide layer 20. Further, an equivalent electrical thickness of the depletion region, which serves as the equivalent insulating layer, is 800 Å*3.8/11.5=284 Å. When an equivalent electrical thickness of the gate oxide 20, which is arranged below the depletion region and serves as the insulating layer, is 500 Å, the equivalent electrical thickness of the insulating layer of the field plate capacitor formed in the field-plate region is the sum of 500 Å and 284 Å, which is 784 Å.

In the present disclosure, the portion of the polysilicon field plate 30 projected onto the drift region 11 includes a plurality of field-plate regions having different doping concentrations. While the device is operating, equivalent electrical thicknesses of various insulating layers of various depletion regions formed at various field-plate regions having various doping concentrations may be various. Further, the gate oxide layer 20, which is arranged under each of the various field-plate regions, and the various field-plate regions having the various doping concentrations are cooperatively configured as the insulating layer, the various equivalent electrical thicknesses of the insulating layers are obtained. In this way, the equivalent electrical thickness of the insulating layer of the field plate capacitor may vary by following a certain rule. For example, in the direction from the end of the drift region near the well region 12 approaching the drain region 110, the equivalent electrical thickness of the insulating layer of the field plate capacitor gradually increases, to improve the performance of the semiconductor device 1.

In detail, as shown in FIG. 2 to FIG. 9, the gate oxide layer 20 may be a flat oxide layer or a step-shaped oxide layer. The polysilicon field plate 30 may include a plurality of field-plate regions having a same or different doping concentrations. The plurality of field-plate regions having the same or different doping concentrations may be arranged alternately or un-alternately. The plurality of field-plate regions and the gate oxide layer 20, which is arranged under each of the plurality of field-plate regions, are cooperatively configured as the various equivalent electrical thicknesses of the various insulating layers, as long as while the semiconductor device 1 is operating, in the direction from the end of the drift region 11 near the well region 12 approaching the drain region 110, the equivalent electrical thickness of the insulating layer, which is disposed in the field plate capacitor formed by the portion of the polysilicon field plate 30 projected onto the drift region 11 and the drift region 11, gradually increases.

In a first embodiment, as shown in FIG. 2 to FIG. 3, the gate oxide layer 20 is the flat oxide layer. In the direction from the end of the drift region 11 near the well region 12 approaching the drain region 110, the portion of the polysilicon field plate 30 projected onto the drift region 11 includes at least two field-plate regions, and doping concentration of the at least two field-plate regions decreases stepwisely. For example, the at least two field-plate regions include one field-plate region disposed near the end of the drift region 11 near the well region 12 and another field-plate region disposed near the drain region, a doping concentration of the one field-plate region near the end of the drift region 11 near the well region 12 is greater than a doping concentration of the another field-plate region disposed near the drain region. As the doping concentration of the polysilicon field plate 30 decreases, the equivalent electrical thickness of the formed insulation layer of the depletion region increases. In this way, while the device is operating, the equivalent electrical thickness of the insulation layers of the depletion region formed by the at least two field-plate regions gradually increases, i.e., the equivalent electrical thickness of one of the insulation layers corresponding to the polysilicon field plate 30 having a higher doping concentration is less than the equivalent electrical thickness of another one of the insulation layers corresponding to the polysilicon field plate 30 having a lower doping concentration. In some embodiments, the doping concentration of the portion of the polysilicon field plate 30 projected onto the drift region 11 gradually decreases. It will be understood that when the gate oxide layer 20 is the flat oxide layer, the change in the equivalent electrical thickness of the insulating layer between the portion of the polysilicon field plate 30 projected on the drift region 11 and the drift region 11 for forming the field plate capacitor is dependent only on the variation in the doping concentration of the field-plate region in the portion of the polysilicon field plate 30 projected on the drift region 11, resulting in a difference between equivalent electrical thicknesses of the insulating layers of the depletion regions in various field-plate regions. Therefore, in these embodiments, in the direction from the end of the drift region 11 near the well region 12 approaching the drain region 110, the portion of the polysilicon field plate 30 projected on the drift region 11 may have a plurality of field-plate regions having different doping concentrations. Further, the plurality of field-plate regions include two adjacent field-plate regions, one of the two adjacent field-plate regions is disposed near the drain region 110, and the other one of the two adjacent field-plate regions is disposed away from the drain region 110. The doping concentration of the one of the two adjacent field-plate regions is less than the doping concentration of the other one of the two adjacent field-plate regions. In this way, while the device is operating, the equivalent electrical thickness of the insulation layer of the depletion region formed by the portion of the polysilicon field plate 30 projected onto the drift region 11 gradually increases.

In some embodiments, the other portion of the polysilicon field plate 30 that is not projected onto the drift region 11 may be a doped field-plate region. The portion of the polysilicon field plate 30 projected onto the drift region 11 include at least two field-plate regions, and the at least two field-plate regions include a doped field-plate region and a non-doped field-plate region. A doping concentration of the doped field plate in the portion of the polysilicon field plate 30 projected onto the drift region 11 may be the same as a doping concentration of the doped field-plate region in the other portion of the polysilicon field plate 30 that is not projected onto the drift region 11. Further, in relative to the non-doped field-plate region, the doped field-plate region is disposed closer to the other portion of the polysilicon field plate 30 that is not projected onto the drift region 11. In this way, the equivalent electrical thickness of the insulation layer between the portion of the polysilicon field plate 30 projected onto the drift region 11 and the drift region 11 for forming the field plate capacitor gradually increases in the direction approaching the drain region 110.

In an embodiment, as shown in FIG. 2, the portion of the polysilicon field plate 30 projected onto the drift region 11 includes a first field-plate region 31 and a second field-plate region 32. The first field-plate region 31 is the doped field-plate region, and the second field-plate region 32 is the non-doped field-plate region. That is, a doping concentration of the second field-plate region 32 is 0 and is lower than a doping concentration of the first field-plate region 31.

In the present embodiment, the other portion of the polysilicon field plate 30 that is not projected onto the drift region 11 may be the doped field-plate region having a doping concentration equal to the doping concentration of the first field-plate region 31. Therefore, in the direction from the end of the drift region 11 near the well region 12 approaching the drain region 110, the doping concentration of the portion of the polysilicon field plate 30 projected onto the drift region 11 varies from a higher concentration (the same doping concentration as the portion of the polysilicon field plate 30 that is not projected onto the drift region 11) to a lower concentration (a doping concentration of 0).

In some embodiments, each of the first field-plate region 31 and the other portion of the polysilicon field plate 30 that is not projected onto the drift region 11 may be a heavily doped region. While the device is operating, the voltage applied to the polysilicon field plate 30, the depletion region formed in the first field-plate region 31 is extremely small, and the equivalent electrical thickness of the equivalent insulation layer of the formed the depletion region is extremely small and negligible. The doping concentration of the second field-plate region 32 is 0, and that is, the second field-plate region 32 is the non-doped field-plate region. An interface, which is inside the second field-plate region 32 and is disposed near the gate oxide layer 20, may form a depletion region having a certain thickness, and that is, an equivalent insulation layer having a certain equivalent electrical thickness is formed. Therefore, although the portion of the gate oxide 20 projected onto the drift region 11 is the flat layer, in the direction from the end of the drift region 11 near the well region 12 approaching the drain region 110, the equivalent electrical thickness of the insulating layer between the portion of the polysilicon field plate 30 projected onto the drift region 11 and the drift region for forming the field plate capacitor may increase in a one-step-wise manner. That is, the equivalent electrical thickness of the insulating layer of the field plate capacitor gradually increases, and the capacitance value of the field plate capacitor gradually decreases. The "one-step-wise manner" indicates that the equivalent electrical thickness of the insulation layer between the portion of the polysilicon field plate 30 projected onto the drift region 11 and the drift region has two different equivalent electrical thicknesses of two insulation layers.

In some embodiments, as shown in FIG. 3, the portion of the polysilicon field plate 30 projected onto the drift region 11 includes the first field-plate region 31, the second field-plate region 32 and a third field-plate region 301. Similar to the embodiment shown in FIG. 2, the doping concentration of the first field-plate region 31 is the same as the doping concentration of the other portion of the polysilicon field plate 30 that is not projected on the drift region 11, which is the heavily doped region. The doping concentration of the second field-plate region 32 is less than the doping concentration of the first field-plate region 31. For example, the second field-plate region 32 may be a moderately doped region. A doping concentration of the third field-plate region 301 is 0, i.e., the non-doped field-plate region. Therefore, in the direction from the end of the drift region 11 near the well region 12 approaching the drain region 110, the doping concentration of the portion of the polysilicon field plate 30 projected onto the drift region 11 varies from a higher concentration (the same doping concentration as the other portion of the polysilicon field plate 30 that is not projected onto the drift region 11) to a medium concentration (a moderate doping concentration) and further to a lower concentration (the doping concentration of 0).

While the device is operating, the equivalent electrical thickness of the equivalent insulating layer of the depletion region generated by the portion of the first field-plate region 31 projected onto the drift region is less than the equivalent electrical thickness of the equivalent insulating layer in the depletion region generated by the second field-plate region 32. The equivalent electrical thickness of the equivalent insulating layer in the depletion region generated by the second field-plate region 32 is less than the equivalent electrical thickness of the equivalent insulating layer in the depletion region generated by the third field-plate region 301. The equivalent electrical thickness of the insulating layer between the portion of the polysilicon field plate 30 projected onto the drift region 11 and the drift region for forming the field plate capacitor increases in a two-step-wise manner. The "two-step-wise manner" indicates that the equivalent electrical thickness of the insulating layer between the portion of the polysilicon field plate 30 projected onto the drift region 11 and the drift region for forming the field plate capacitor has three different thicknesses of three insulating layers.

Certainly, the portion of the polysilicon field plate 30 projected onto the drift region 11 may include four or five or even more polysilicon field-plate regions having a plurality of doping concentrations different from each other, and in the direction from the end of the drift region 11 near the well region 12 approaching the drain region 110, and the plurality of doping concentrations, which are arranged on the drift region 11, successively decreases. In this way, the equivalent electrical thickness of the insulation layer between the portion of the polysilicon field plate 30 projected onto the drift region 11 and the drift region 11 gradually increases in the direction approaching the drain region 110.

In addition, any ordinary skilled person in the art shall understand that in the direction from the end of the drift region 11 near the well region 12 approaching the drain region 110, the doping concentration of the portion of the polysilicon field plate 30 projected onto the drift region 11 may also be gradually decreased, such as decreased approximately linearly. Therefore, the portion of the polysilicon field plate 30 projected onto the drift region 11 may be equivalent to a set of a plurality of field-plate regions. Further, in the direction approaching the drain region 110, a doping concentration of a field-plate region of a next stage is lower than that of a previous stage, such that the equivalent electrical thickness of the insulation layer between the portion of the polysilicon field plate 30 projected onto the drift region 11 and the drift region 11 gradually increases, and the capacitance value of the field plate capacitor gradually decreases.

In the above embodiments, although the gate oxide layer 20 is the flat oxide layer, the doping concentration of the portion of the polysilicon field plate 30 projected onto the drift region 11 may be changed to allow the equivalent electrical thickness of the insulating layer between the portion of the polysilicon field plate 30 projected onto the drift region 11 and the drift region 11 for forming the field plate capacitor to gradually increase, and to allow the capacitance value of the field plate capacitor to gradually decrease, such that the performance of the semiconductor device 1 is improved. In addition, compared to the polysilicon field plate 30 in the art, which is entirely doped, while manufacturing the non-doped second field-plate region 32 as shown in FIG. 2 (i.e. only a portion of the polysilicon field plate 30 is doped), an extra manufacturing process is not performed, and an increase in costs may not be generated.

In a second embodiments, as shown in FIGS. 4 to 8, the gate oxide layer 20 is a step-shaped oxide layer and includes at least a first gate oxide region 21 having a first thickness and a second gate oxide region 22 having a second thickness, and the second thickness is greater than the first thickness. That is, each of the first gate oxide region 21 and the second gate oxide region 22 serves as an insulating layer. Further, an equivalent electrical thickness of the insulating layer provided by the first gate oxide region 21 is less than an equivalent electrical thickness of the insulating layer provided by the second gate oxide region 22.

The polysilicon field plate 30 includes a first field plate 33 arranged on a first gate oxide region 21 and a second field plate 34 arranged on a second gate oxide region 22. In some embodiments, the first field plate 33 and the second field plate 34 are configured as an integral one-piece component and may be manufactured by performing one process. A portion of the first field plate 33 is projected onto the drift region 11, and the second field plate 34 is projected onto the drift region 11. At least one of the portion of the first field plate 33 projected onto the drift region 11 or the second field plate 34 includes at least two field-plate regions having different doping concentrations. Further, in the direction from the end of the drift region 11 near the well region 12 approaching the drain region 110, doping concentrations of the at least two field-plate regions of the portion of the first field plate 33 projected onto the drift region 11, and/or doping concentrations of the at least two field-plate regions of the second field plate 34 gradually decrease. In some embodiments, in the direction from the end of the drift region 11 near the well region 12 approaching the drain region 110, the doping concentration of at least one of the portion of the first field plate 33 projected onto the drift region 11 and/or the second field plate 34 gradually decreases. In this way, in the direction approaching the drain region 110, the equivalent electrical thickness of the insulating layer between the portion of the polysilicon field plate 30 projected onto the drift region 11 and the drift region 11 for forming the field plate capacitor gradually increases, allowing the performing of the semiconductor device 1 to be improved.

The portion of the first field plate 33 projected onto the drift region 11 has a last field plate disposed near the second gate oxide region 22. The second field plate 34 has a first field plate disposed near the first gate oxide region 21. While the semiconductor device 1 is operating, a sum of the equivalent electrical thickness of the insulation layer of the depletion region, which is formed in the last field-plate region, and the equivalent electrical thickness of the first gate oxide region 21 is less than a sum of the equivalent electrical thickness of the insulation layer of the depletion region, which is formed in the first field-plate region, and the equivalent electrical thickness of the second gate oxide region 22. In this way, in the direction from the end of the drift region 11 near the well region 12 approaching the drain region 110, for the portion of the polysilicon field plate 30 projected onto the drift region 11, the equivalent electrical thickness of the insulating layer between the polysilicon field plate 30 and the drift region 11 for forming the field plate capacitor gradually increases.

In an implementation, as shown in FIG. 4, the portion of the first field plate 33 projected onto the drift region 11 includes at least two field-plate regions having different doping concentrations. The at least two field-plate regions include a first doped field-plate region 331 and a first non-doped field-plate region 332. With respect to the first doped field-plate region 331, the first non-doped field-plate region 332 is disposed closer to the second gate oxide region 22. Further, the second field plate 34 includes a second doped field-plate region 341. In the present embodiment, each of a doping concentration of the first doped field-plate region 331 and a doping concentration of the second doped field-plate region 341 may be equal to a doping concentration of the portion of the first field-plate region 33 that is not projected onto the drift region 11. For example, the first doped field-plate region 331 and the second doped field-plate region 341 are heavily doped regions and may be formed simultaneously by performing one doping process.

While the device is operating, a sum of the equivalent electrical thickness of the insulation layer of the depletion region, which is formed in the first non-doped field-plate region 332, and the equivalent electrical thickness of the first gate oxide region 21 is less than a sum of the equivalent electrical thickness of the insulation layer of the depletion region, which is formed in the second doped field-plate region 341, and the equivalent electrical thickness of the second gate oxide region 22.

It shall be understood that, each of the doping concentration of the first doped field-plate region 331 and the doping concentration of the second doped field-plate region 341 may be equal to the doping concentration of the portion of the first field plate 33 that is not projected onto the drift region 11, and the first doped field-plate region 331 and the second doped field-plate region 341 may be the heavily doped regions. The formed depletion regions may be extremely small and may be negligible. However, the sum of the equivalent electrical thickness of the insulating layer of the depletion region, which is formed in the first non-doped field-plate region 332, and the equivalent electrical thickness of the insulating layer in the first gate oxide region 21 must be greater than the sum of the equivalent electrical thickness of the insulating layer of the depletion region, which is formed in the first doped field-plate region 331, and the equivalent electrical thickness of the insulating layer in the first gate oxide region 21. The equivalent electrical thickness of the insulating layer of the second gate oxide region 22 is greater than the equivalent electrical thickness of the insulating layer of the first gate oxide region 21. Further, the entire second doped field-plate region 341 is disposed on the second gate oxide region 22. Therefore, although the second doped field-plate region 341 is the heavily doped region and forms an extremely small depletion region, the equivalent electrical thickness of the insulating layer of the second gate oxide region 22 is greater than the equivalent electrical thickness of the insulating layer of the first gate oxide region 21, and therefore, the equivalent electrical thickness of the insulating layer between the second doped field-plate region 341 and the drift region 11 for forming the field plate capacitor is greater than the equivalent electrical thickness of the insulating layer between the first non-doped field-plate region 332 and the drift region 11 for forming the field plate capacitor.

In the manufacturing process, the equivalent electrical thickness of the first gate oxide region 21 is in a range of 0 to 120 Å. While the device is operating, the equivalent electrical thickness of the insulation layer of the depletion region formed by the first non-doped field-plate region 332 is approximately 284 Å (based on calculating the equivalent electrical thickness of the insulation layer of the depletion region as shown in the above). Of course, in practice, the equivalent electrical thickness may be less than 284 Å. The equivalent electrical thickness of the second gate oxide region 22 is in a range of 500 Å to 1000 Å. Therefore, apparently, a maximum of the equivalent electrical thickness of the insulating layer between the first non-doped field-plate region 332 and the drift region 11 for forming the field plate capacitor is approximately 400 Å (120 Å plus 284 Å), and is less than the equivalent electrical thickness of the second gate oxide region 22.

As shown in FIG. 4, the gate oxide layer 20 is a one-step-shaped oxide layer. However, the doping concentration of the portion of the polysilicon field plate 30 projected onto the drift region 11 may be changed to allow the equivalent electrical thickness of the insulating layer between the portion of the polysilicon field plate 30 projected onto the drift region 11 and the drift region for forming the field plate capacitor to increase in a two-step-wise manner, further improving the performance of the semiconductor device 1. In addition, as shown in FIG. 4, in the present embodiment, the portion of the polysilicon field plate 30 is configured as the first non-doped field-plate region 332 only. That is, in the manufacturing process, only a portion of the polysilicon field plate 30 is doped. Therefore, compared to the polysilicon field plate 30 in the art, which is entirely doped, manufacturing the polysilicon field plate 30 of the present embodiment does not introduce an extra manufacturing process and does not cause an increase in costs, but the performance of the semiconductor device 1 is further improved.

In the present embodiment, the first non-doped field-plate region 332 is disposed at a junction between the first field plate 33 and the second field plate 34, i.e., at an edge of a step of the step-shaped gate oxide layer 20. As mentioned above, an equivalent electrical thickness of the first gate oxide region 21 is in a range of 0 to 120 Å, and an equivalent electrical thickness of the second gate oxide region 22 is in a range of 500 Å to 1000 Å. The equivalent electrical thickness of the second gate oxide region 22 may significantly increase relative to the equivalent electrical thickness of the first gate oxide region 21. The first non-doped field-plate region 332 is arranged at a position where the equivalent electrical thickness of the step-shaped gate oxide layer 20 varies. The equivalent electrical thickness of the depletion region, which is formed while the first non-doped field-plate region 332 is operating, is relatively small. Therefore, the first non-doped field-plate region 332 is arranged at the junction between the first field plate 33 and the second field plate 34. In this way, the equivalent electrical thickness of the insulating layer of the field plate capacitor may increase successively step by step, allowing the equivalent electrical thickness to increase relatively smoothly, where the equivalent electrical thickness increases almost linearly.

In another implementation, as shown in FIG. 5, the portion of the first field plate 33 projected onto the drift region 11 includes at least two field-plate regions having different doping concentrations. The at least two field-plate regions include the first doped field-plate region 331 and the first non-doped field-plate region 332. With respect to the first doped field-plate region 331, the first undoped field-plate region 332 is disposed closer to the second gate oxide region 22. Further, the second polysilicon gate 34 includes a second non-doped field-plate region 342. In the present embodiment, the doping concentration of the first doped field-plate region 331 is equal to the doping concentration of the portion of the first field plate 33 that is not projected onto the drift region 11. For example, the first doped field-plate region 331 and the portion of the first field plate 33 that is not projected onto the drift region 11 may be the heavily doped regions and may be formed simultaneously by performing one doping process. The doping concentration of the first non-doped field-plate region 332 and the doping concentration of the second non-doped field-plate region 342 may be 0.

It shall be understood that, while the device is operating, the sum of the equivalent electrical thickness of the insulating layer of the depletion region, which is formed in the first non-doped field-plate region 332, and the equivalent electrical thickness of the insulating layer in the first gate oxide region 21 is greater than the sum of the equivalent electrical thickness of the insulating layer of the depletion region, which is formed in the first doped field-plate region 331, and the equivalent electrical thickness of the insulating layer in the first gate oxide region 21. The equivalent electrical thickness of the insulating layer in the second gate oxide region 22 is greater than the equivalent electrical thickness of the insulating layer in the first gate oxide region 21. The sum of the equivalent electrical thickness of the insulating layer of the depletion region, which is formed in the second non-doped field-plate region 342k, and the equivalent electrical thickness of the insulating layer in the second gate oxide region 22 is certainly greater than the sum of the equivalent electrical thickness of the insulating layer of the depletion region, which is formed in the first non-doped field-plate region 332, and the equivalent electrical thickness of the insulating layer in the first gate oxide region 21. The second non-doped field-plate region 342 is entirely disposed on the second gate oxide region 22. Therefore, the equivalent electrical thickness of the insulating layer between the second non-doped field-plate region 342 and the drift region 11 for forming the field plate capacitor is greater than the equivalent electrical thickness of the insulating layer between the first non-doped field-plate region 332 and the drift region 11 for forming the field plate capacitor.

As shown in FIG. 5, although the gate oxide layer 20 is a one-step-shaped oxide layer, the doping concentration of the portion of the polysilicon field plate 30 projected onto the drift region 11 may be changed to allow the equivalent electrical thickness of the insulating layer between the portion of the polysilicon field plate 30 projected onto the drift region 11 and the drift region for forming the field plate capacitor to increase in a two-step-wise manner, further improving the performance of the semiconductor device 1.

In addition, as shown in FIG. 5, in the present embodiment, only a part of the polysilicon field plate 30 is configured as the first non-doped field-plate region 332 and the second non-doped field-plate region 342. That is, compared to the polysilicon field plate 30 in the art, which is entirely doped, only a part of the polysilicon field plate 30 is doped in the manufacturing process of the present disclosure, no extra manufacturing process is introduced, and an increase in costs is not caused, but the performance of the semiconductor device 1 is improved.

In another implementation, as shown in FIG. 6, the portion of the first field plate 33 projected onto the drift region 11 includes a first doped field-plate region 331. The second field plate 34 includes at least two field-plate regions having different doping concentrations. The at least two field-plate regions include a second doped field-plate region 341 and a second non-doped field-plate region 342. With respect to the second doped field-plate region 341, the second non-doped field-plate region 342 is disposed away from the first gate oxide region 21. In the present embodiment, each of a doping concentration of the first doped field-plate region 331 and a doping concentration of the second doped field-plate region 341 may be equal to the doping concentration of the portion of the first field plate 33 that is not projected onto the drift region 11. For example, the first doped field-plate region 331 and the second doped field-plate region 341 may be the heavily doped regions and may be formed simultaneously in one doping process.

It shall be understood that, while the device is operating, the sum of the equivalent electrical thickness of the insulating layer of the depletion region, which is formed in the second doped field-plate region 341, and the equivalent electrical thickness of the insulating layer in the second gate oxide region 22 is certainly greater than the sum of the equivalent electrical thickness of the insulating layer of the depletion region, which is formed in the first doped field-plate region 331, and the equivalent electrical thickness of the insulating layer in the first gate oxide region 21. The equivalent electrical thickness of the insulating layer in the second gate oxide region 22 is greater than the equivalent electrical thickness of the insulating layer in the first gate oxide region 21. Further, the second doped field-plate region 341 and the second non-doped field-plate region 342 are entirely disposed on the second gate oxide region 22. Therefore, the sum of the equivalent electrical thickness of the insulating layer of the depletion region, which is formed in the second undoped field-plate region 342, and the equivalent electrical thickness of the insulating layer in the second gate oxide region 22 is greater than the sum of the equivalent electrical thickness of the insulating layer of the depletion region, which is formed in the second doped field-plate region 341, and the equivalent electrical thickness of the insulating layer in the second gate oxide region 22.

Therefore, as shown in FIG. 6, although the gate oxide layer 20 is a one-step-shaped oxide layer, the doping concentration of the portion of the polysilicon field plate 30 projected onto the drift region 11 may be changed to allow the equivalent electrical thickness of the insulating layer between the portion of the polysilicon field plate 30 projected onto the drift region 11 and the drift region for forming the field plate capacitor to increase in a two-step-wise manner, further improving the performance of the semiconductor device 1. In addition, as shown in FIG. 6, in the present embodiment, only a part of the polysilicon field plate 30 is configured as the second non-doped field-plate region 342, that is, only a part of the polysilicon field plate 30 is doped in the manufacturing process. Therefore, compared to the polysilicon field plate 30 in the art, which is entirely doped, in the present disclosure, no extra manufacturing process is introduced, and an increase in costs is not caused, but the performance of the semiconductor device 1 is improved.

In another implementation, as shown in FIG. 7, the portion of the first field plate 33 projected onto the drift region includes at least two field-plate regions having different doping concentrations. The at least two field-plate regions include a first doped field-plate region 331 and a first non-doped field-plate region 332. With respect to the first doped field-plate region 331, the first non-doped field-plate region 332 is disposed closer to the second gate oxide region 22. The second field plate 34 includes at least two field-plate regions having different doping concentrations. The at least two field-plate regions include a second doped field-plate region 341 and a second non-doped field-plate region 342. With respect to the second doped field-plate region 341, the second non-doped field-plate region 342 is disposed away from the first gate oxide region 21. In the present embodiment, each of a doping concentration of the first doped field-plate region 331 and a doping concentration of the second doped field-plate region 341 may be equal to the doping concentration of the portion of the first field plate 33 that is not projected onto the drift region 11. For example, the first doped field-plate region 331 and the second doped field-plate region 341 may be the heavily doped regions and may be formed simultaneously by performing one doping process. A doping concentration of the first non-doped field-plate region 332 and a doping concentration of the second non-doped field-plate region 342 may be 0.

It shall be understood that, while the device is operating, the sum of the equivalent electrical thickness of the insulation layer of the depletion region, which is formed in the first non-doped field-plate region 332, and the equivalent electrical thickness of the insulation layer in the first gate oxide region 21 is greater than the sum of the equivalent electrical thickness of the insulation layer in the first doped field-plate region 331 and the insulation layer in the first gate oxide region 21. The sum of the equivalent electrical thickness of the insulating layer of the depletion region, which is formed in the second doped field-plate region 341, and the equivalent electrical thickness of the insulating layer in the second gate oxide region 22 is greater than the sum of the equivalent electrical thickness of the insulating layer of the depletion region, which is formed in the first non-doped field-plate region 332, and the equivalent electrical thickness of the insulating layer in the first gate oxide region 21. The sum of the equivalent electrical thickness of the insulating layer of the depletion region, which is formed in the second non-doped field-plate region 342, and the equivalent electrical thickness of the insulating layer in the second gate oxide region 22 is greater than the sum of the equivalent electrical thickness of the insulating layer of the depletion region, which is formed in the second doped field-plate region 341, and the equivalent electrical thickness of the insulating layer in the second gate oxide region 22.

Therefore, as shown in FIG. 7, although the gate oxide layer 20 is a one-step-shaped oxide layer, the doping concentration of the portion of the polysilicon field plate 30 projected onto the drift region 11 may be changed to allow the equivalent electrical thickness of the insulating layer between the portion of the polysilicon field plate 30 projected onto the drift region 11 and the drift region for forming the field plate capacitor to increase in a three-step-wise manner, further improving the performance of the semiconductor device 1. The "three-step-wise" indicates that the equivalent electrical thickness of the insulating layer between the portion of the polysilicon field plate 30 projected onto the drift region 11 and the drift region for forming the field plate capacitor has four different thicknesses of four insulating layers. In addition, as shown in FIG. 7, in the present embodiment, only a part of the polysilicon field plate 30 is configured as the first non-doped field-plate region 332 and the second non-doped field-plate region 342, and that is, only a part of the polysilicon field plate 30 is doped in the manufacturing process. Therefore, compared to the polysilicon field plate 30 in the art, which is entirely doped, in the present disclosure, no extra manufacturing process is introduced, and an increase in costs is not caused, but the performance of the semiconductor device 1 is improved.

In another implementation, as shown in FIG. 8, the portion of the first field plate 33 projected onto the drift region includes at least two field-plate regions having different doping concentrations. The at least two field-plate regions include a first doped field-plate region 331, a first intermediate doped field-plate region 333, and a first non-doped field-plate region 332. With respect to the first doped field-plate region 331, the first non-doped field-plate region 332 is disposed closer to the second gate oxide region 22, the first intermediate doped field-plate region 333 is disposed located between the first doped field-plate region 331 and the first non-doped field-plate region 332. The second field-plate region 34 includes at least two field-plate regions having different doping concentrations. The at least two field-plate regions include a second doped field-plate region 341, a second intermediate doped field-plate region 343, and a second non-doped field-plate region 342. With respect to the second doped field-plate region 341, the second non-doped field-plate region 342 is disposed located away from the first gate oxide region 21. The second intermediate doped field-plate region 343 is disposed between the second doped field-plate region 341 and the second doped field-plate region 342. In the present embodiment, each of a doping concentration of the first doped field-plate region 331 and a doping concentration of the second doped field-plate region 341 may be equal to the doping concentration of the portion of the first field plate 33 that is not projected onto the drift region 11. For example, the first doped field-plate region 331 and the second doped field-plate region 341 may be the heavily doped regions. A doping concentration of the first non-doped field-plate region 332 and a doping concentration of the second non-doped field-plate region 341 may be 0. The doping concentration of the first intermediate doped field-plate region 331 may be equal to the doping concentration of the second intermediate doped field-plate region 343. For example, the first intermediate doped field-plate region 331 and the second intermediate doped field-plate region 343 may be moderately doped regions. It is understood that the doping concentration of the first doped field-plate region 331 is greater than the doping concentration of the first intermediate doped field-plate region 333, and the doping concentration of the first intermediate doped field-plate region 333 is greater than the doping concentration of the first non-doped field-plate region 332. The doping concentration of the second doped field-plate region 341 is greater than the doping concentration of the second intermediate doped field-plate region 343, and the doping concentration of the second intermediate doped field-plate region 343 is greater than the doping concentration of the second non-doped field-plate region 342.

It shall be understood that a sum of the equivalent electrical thickness of the insulation layer of the depletion region, which is formed in the first intermediate doped field-plate region 333, and the equivalent electrical thickness of the insulation layer of the first gate oxide region 21 is greater than a sum of the equivalent electrical thickness of the insulation layer of the depletion region, which is formed in the first doped field-plate region 331, and the equivalent electrical thickness of the insulation layer of the first gate oxide region 21. A sum of the equivalent electrical thickness of the insulation layer of the depletion region, which is formed in the first non-doped field-plate region 332, and the equivalent electrical thickness of the insulation layer of the first gate oxide region 21 is greater than a sum of the equivalent electrical thickness of the insulation layer of the depletion region, which is formed in the first intermediate doped field-plate region 333, and the equivalent electrical thickness of the insulation layer of the first gate oxide region 21. A sum of the equivalent electrical thickness of the insulation layer of the depletion region, which is formed in the second doped field-plate region 341, and the equivalent electrical thickness of the insulation layer of the second gate oxide region 22 is greater than the sum of the equivalent electrical thickness of the insulation layer of the depletion region, which is formed in the first non-doped field-plate region 332, and the equivalent electrical thickness of the insulation layer of the first gate oxide region 21. A sum of the equivalent electrical thickness of the insulation layer of the depletion region, which is formed in the second intermediate doped field-plate region 343, and the equivalent electrical thickness of the insulation layer of the first undoped field-plate region 22 is greater than the sum of the equivalent electrical thickness of the insulation layer of the depletion region, which is formed in the second doped field-plate region 341, and the equivalent electrical thickness of the insulation layer of the second gate oxide region 22. The sum of the equivalent electrical thickness of the insulation layer of the depletion region, which is formed in the second non-doped field-plate region 342, and the equivalent electrical thickness of the insulation layer in the second gate oxide region 22 is greater than a sum of the equivalent electrical thickness of the insulation layer of the depletion region, which is formed in the second intermediate doped field-plate region 343, and the equivalent electrical thickness of the insulation layer in the first gate oxide region 21. Therefore, as shown in FIG. 8, although the gate oxide layer 20 is a one-step-shaped layer, the doping concentration of the portion of the polysilicon field plate 30 projected onto the drift region 11 is changed to allow the equivalent electrical thickness of the insulating layer between the portion of the polysilicon field plate 30 projected onto the drift region 11 and the drift region for forming the field plate capacitor to increase in a five-step-wise manner, further improving the performance of the semiconductor device 1. The "five-step-wise" indicates that the equivalent electrical thickness of the insulating layer between the portion of the polysilicon field plate 30 projected onto the drift region 11 and the drift region for forming the field plate capacitor has six different thicknesses of six insulating layers.

According to the above embodiments, a side of the first non-doped field-plate region 332 near the drain region is aligned with the junction between the first field plate 33 and the second field plate 34, and/or the second non-doped field-plate region 342 is disposed at an end portion of the second field plate 34 near the drain region. A dramatic change in the equivalent electrical thickness is present at a junction between the insulating layer of the second gate oxide region 22 and the insulating layer of the first gate oxide region 21, and insulating performance of the gate oxide layer 20 is greater than equivalent insulating performance of the depletion region formed by the field plate 30. Therefore, the side of the first non-doped field-plate region 332 near the drain region is configured to be aligned with the junction between the second gate oxide region 22 and the first gate oxide region 21. In this way, the equivalent electrical thickness of the insulating layer of the field plate capacitor may be increased in a stepwise manner, such that the increase in the equivalent electrical thickness may be relatively gentle and is almost linear. Further, the second non-doped field-plate region 342 is arranged at an edge of the polysilicon field plate 30 near the drain region. In this way, the equivalent electrical thickness, which is in a multi-step shape, may be changed in the stepwise manner, and at the same time, a change in the equivalent electrical thickness, which is in the one-step shape, may be increased, further improving the performance of the semiconductor device 1.

In the third embodiment, as shown in FIG. 9, the step-shaped gate oxide layer 20 is in the multi-step shape and further includes at least a third gate oxide layer region 23 in a third thickness. The third thickness is greater than the second thickness. Apparently, the equivalent electrical thickness of the insulating layer of the third gate oxide region 23 is greater than the equivalent electrical thickness of the insulating layer of the second gate oxide region 22, and the equivalent electrical thickness of the insulating layer of the second gate oxide region 22 is greater than the equivalent electrical thickness of the insulating layer of the first gate oxide region 21.

The polysilicon field plate 30 further includes a third field plate 35 disposed on the third gate oxide region 23. In some embodiments, the first field plate 33, the second field plate 34, and the third field plate 35 are configured as an integral one-piece structure and may be formed by performing one process. The third field plate 35 is projected onto the drift region 11. At least one of the portion of the first field plate 33 projected onto the drift region 11, the second field plate 34, and the third field plate 35 includes at least two field-plate regions having different doping concentrations. In the direction from the end of the drift region 11 near the well region approaching the drain region, doping concentrations of the at least two field-plate regions of the portion of the first field plate 33 projected onto the drift region 11 decrease successively, and/or doping concentrations of the at least two field-plate regions of the second field plate 34 decrease successively, and/or doping concentrations of the at least two field-plate regions of the third field plate 35 decrease successively. In some embodiments, in the direction from the end of the drift region 11 near the well region approaching the drain region 110, at least one of the doping concentration of the portion of the first field plate 33 projected onto the drift region 11, the doping concentration of the second field plate 34, and the doping concentration of the third field plate 35 gradually decreases.

In detail, as shown in FIG. 9, the portion of the first field plate 33 projected onto the drift region includes at least two field-plate regions having different doping concentrations. The at least two field-plate regions include a first doped field-plate region 331 and a first non-doped field-plate region 332. With respect to the first doped field-plate region 331, the first non-doped polysilicon gate region 332 is disposed closer to the second gate oxide region 22. The second field plate 34 includes at least two field-plate regions having different doping concentrations. The at least two field-plate regions include a second doped field-plate region 341 and a second non-doped field-plate region 342. The second non-doped field-plate region 342 is disposed close to the third gate oxide region 23. The third field plate 35 includes at least two field-plate regions having different doping concentrations. The at least two field-plate regions include a third doped field-plate region 351 and a third non-doped field-plate region 352. With respect to the third doped field-plate region 351, the third non-doped field-plate region 352 is disposed away from the second gate oxide region 22. In the present embodiment, each of a doping concentration of the first doped field-plate region 331, a doping concentration of the second doped field-plate region 341, and a doping concentration of the third doped field-plate region 351 may be equal to the doping concentration of the portion of the first field plate 33 that is not projected onto the drift region 11. For example, the first doped field-plate region 331, the second doped field-plate region 341, and the third doped field-plate region 351 may be the heavily doped regions and may be formed simultaneously by performing one doping process. A doping concentration of the first non-doped field-plate region 332, a doping concentration of the second non-doped field-plate region 342, and a doping concentration of the third non-doped field-plate region 352 may be 0.

While the device is operating, a sum of the equivalent electrical thickness of the insulation layer of the depletion region, which is formed in the first doped field-plate region 331, and the equivalent electrical thickness of the first gate oxide region 21 is less than a sum of the equivalent electrical thickness of the insulation layer of the depletion region, which is formed in the first non-doped field-plate region 332, and the equivalent electrical thickness of the first gate oxide region 21. A sum of the equivalent electrical thickness of the insulation layer of the depletion region, which is formed in the second doped field-plate region 341, and the equivalent electrical thickness of the second gate oxide region 22 is less than a sum of the equivalent electrical thickness of the insulation layer of the depletion region, which is formed in the second non-doped field-plate region 342, and the equivalent electrical thickness of the second gate oxide region 22. A sum of the equivalent electrical thickness of the insulation layer of the depletion region, which is formed in the third doped field-plate region 351, and the equivalent electrical thickness of the third gate oxide region 23 is less than a sum of the equivalent electrical thickness of the insulation layer of the depletion region, which is formed in the third non-doped field-plate region 352, and the equivalent electrical thickness of the third gate oxide region 23. The sum of the equivalent electrical thickness of the insulation layer of the depletion region, which is formed in the first non-doped field-plate region 332, and the equivalent electrical thickness of the first gate oxide region 21 is less than the equivalent electrical thickness of the second gate oxide region 22. The sum of the equivalent electrical thickness of the insulating layer of the depletion region, which is formed in the second non-doped field-plate region 342, and the equivalent electrical thickness of the second gate oxide region 22 is less than the equivalent electrical thickness of the third gate oxide region 23. Therefore, as shown in FIG. 9, although the gate oxide layer 20 is a two-step-shaped oxide layer, the doping concentration of the portion of the polysilicon field plate 30 projected onto the drift region 11 may be changed to allow the equivalent electrical thickness of the insulating layer between the portion of the polysilicon field plate 30 projected onto the drift region 11 and the drift region for forming the field plate capacitor to increase in the five-stepwise manner, further improving the performance of the semiconductor device 1.

In some embodiments, the portion of the first field plate 33 arranged on the drift region 11 may further include four or five or even more field-plate regions having a plurality of doping concentrations different from each other. For the portion of the drift region 11, the plurality of doping concentrations decrease stepwisely in the direction from the end of the drift region 11 near the well region 12 approaching the second gate oxide region 22, such that the equivalent electrical thickness of the insulating layer between the portion of the first field plate 33 projected onto the drift region 11 and the drift region 11 for forming the field plate capacitor gradually increases in the direction approaching the second gate oxide region 22. In some embodiments, the doping concentration of the portion of the first field plate 33 disposed on the drift region 11 may gradually decreases, such as decreases approximately linearly. The second field plate 34 is entirely disposed on the drift region 11 and may also include four or five or even more field-plate regions having a plurality of doping concentrations different from each other. The plurality of doping concentrations decrease stepwisely in the direction from an end near the first gate oxide region 21 approaching the third gate oxide region 23, such that the equivalent electrical thickness of the insulating layer between the portion of the second field plate 34 projected onto the drift region 11 and the drift region 11 for forming the field plate capacitor gradually increases in the direction approaching the second gate oxide region 22. In some embodiments, the doping concentration of the second field plate 34 may be gradually decreased, such as decreased approximately linearly. The third field plate 35 may be entirely disposed on the drift region 11 and may include four or five or even more field-plate regions having a plurality of doping concentrations different from each other. Further, the plurality of doping concentrations may decrease stepwisely in the direction from the end near the second gate oxide region 22 approaching the drain region 110, such that the equivalent electrical thickness of the insulating layer between the portion of the third field plate 35 projected onto the drift region 11 and the drift region 11 for forming the field plate capacitor gradually increases in the direction approaching the second gate oxide region 22. In some embodiments, the doping concentration of the third field plate 35 may gradually decreases, such as decreases approximately linearly. Further, the equivalent electrical thickness of the insulation layer between the drift region 11 and a portion of the field plate consisting of the portion of the first field plate 33 projected onto the drift region 11, the second field plate 34, and the third field plate 35 gradually increases in the direction approaching the drain region 110, where the drift region 11 and the portion of the field plate form the field plate capacitor.

As shown in FIG. 10, FIG. 10 is a cross sectional view of a semiconductor device according to another embodiment of the present disclosure.

In the present embodiment, the semiconductor device 1 is a DDDMOS transistor, including basic transistor structures, including the source region 120, the field plate 30, and the drain region 110. In detail, the semiconductor device 1 includes the semiconductor substrate 10, the gate oxide layer 20, and the field plate 30, which are arranged in sequence and laminated. The semiconductor substrate 10 includes two drift regions 11 in the first conductivity type and one well region 12 in the second conductivity type. One of the two drift regions 11 is arranged with the drain region 110, and the other one of the two drift regions 11 is arranged with the source region 120. A projection of the polysilicon field plate 30 on the substrate 10 is disposed between the drain region 110 and the source region 120, and at least a portion of the projection is located inside each of the two drift regions 11.

For the drift region 11 of the drain region 110, structures of the gate oxide layer 20 and the polysilicon field plate 30 in the semiconductor device 1 may have be the same as structures of the gate oxide layer 20 and the polysilicon field plate 30 of the semiconductor device 1 of the LDMOS transistor as described in any of the above embodiments. In this way, while the semiconductor device 1 is operating, in a direction from an end of the drift region 11 near the well region 12 approaching the drain region 110, an equivalent electrical thickness of an insulating layer between the portion of the field plate 30 projected onto the drift region 11 and the drift region 11 for forming the field plate capacitor gradually increases, and a capacitance value of the field plate capacitor gradually decreases, such that the breakdown voltage of the semiconductor device 1 is increased. Of course, any ordinary skilled person in the art that shall understand that for the drift region 11 of the source region 120, the gate oxide layer and the polysilicon field plate 30 of the semiconductor device 2 may be configured to have a similar structure to form the field plate capacitor. In this way, while the device is operating, in the direction from the end of the drift region 11 near the well region 12 approaching the source region 120, the equivalent electrical thickness of the insulating layer between the portion of the polysilicon field plate 30 projected onto the drift region 11 and the drift region 11 for forming the field plate capacitor gradually increases, and the capacitance value of the field plate capacitor gradually decreases.

As shown in FIG. 11, FIG. 11 is a flow chart of a manufacturing process of a semiconductor device according to an embodiment of the present disclosure. The manufacturing process includes the following operations.

In an operation S1, providing a semiconductor substrate. The semiconductor substrate includes a drift region in a first conductive type and a well region in a second conductive type. An end of the drift region away from the well region is configured to form a drain region, and an end of the well region away from the drift region is configured to form a source region.

Firstly, the semiconductor substrate is provided, and an injection process is performed to manufacture the drift region. In detail, a patterned mask (such as a photoresist layer) is formed on a surface of the semiconductor substrate, and an injection region is defined by an opening of the mask. The first conductivity type is, such as, an n-type. In the injection process for forming the drift region, an n-type dopant (such as phosphorus or arsenic) is injected into the injection region of the semiconductor substrate. The injection process may be performed by a combination of shallow injection with low injection energy and deep injection with high injection energy. An injection density and an injection depth of the n-type dopant may be determined based on a size and characteristics of the semiconductor device. After injecting the n-type dopant is completed, the mask is removed.

After injecting the first conductive type for forming the drift region is completed, the injection process is further performed to form the well region in the second conductive type in the semiconductor substrate. The well region extends from an inside of the semiconductor substrate to an upper surface of the semiconductor substrate. The well region and the drift region may correspond to different injection regions, and different dopants are injected for the well region and the drift region. The second conductive type is, such as, a p-type. That is, the p-type well region is formed by injecting boron or boron difluoride (BF2). An injection density and an injection depth of the p-type dopant may be determined based on the size and characteristics of the semiconductor device. After injecting the p-type dopant is completed, the mask is removed.

After the injection processes of the drift region and the well region are completed, a thermal annealing process may be performed to achieve an ion diffusion treatment, such that the injected dopants may be diffused and stabilized to form the drift region and the well region. A time length and a temperature of the thermal process may be determined based on the size and characteristics of the semiconductor device.

In an operation S2, forming a gate oxide layer on the semiconductor substrate.

In detail, the gate oxide layer is formed on the semiconductor substrate. To form the gate oxide layer, a high temperature deposition process and/or a thermal oxidation process may be performed to form a high temperature deposited oxide film and/or a thermal oxide film. In some embodiments, the gate oxide layer may be a step-shaped oxide layer including at least a first gate oxide region having a first thickness and a second gate oxide region having a second thickness, and the second thickness is greater than the first thickness. In detail, the high temperature deposition process may be performed to firstly form the high temperature deposition oxide film on the semiconductor substrate. Subsequently, a portion of the high temperature deposition oxide film is etched away. The etched-away portion of the high temperature deposition oxide film includes the high temperature deposition oxide film that overs the well region and a portion of the high temperature deposition oxide film that covers the drift region. Further, the thermal oxidation process is performed to form the thermal oxide film on the well region and a portion of the drift region. In this way, the step-shaped gate oxide layer is obtained, improving the performance of the semiconductor device.

In an operation S3, forming a field plate on the gate oxide layer, and performing an ion doping process on at least a portion of the field plate, allowing the portion of the field plate projected onto the drift region includes at least two field-plate regions having different doping concentrations.

In detail, the field plate is formed on the gate oxide layer. A portion of the field plate is projected onto the well region, and at least another portion of the field plate is projected onto the drift region. The ion doping process is performed on the at least another portion of the field plate projected onto the drift region, allowing the portion of the field plate that is projected onto the drift region includes at least two field-plate regions having different doping concentrations. In this way, while the device is operating, in the direction from an end of the drift region near the well region approaching the drain region, an equivalent electrical thickness of an insulating layer between the portion of the field plate projected onto the drift region and the drift region for forming the field plate capacitor gradually increases.

While performing the ion doping process on the portion of the field plate projected onto the drift region, an end of the drift region away from the well region may be doped simultaneously to form the drain region, and an end of the well region away from the drift region may form the source region, such that light irradiating is not performed, and the number of processes is not increased In addition, another injection process may be performed to inject the p-type dopant into the semiconductor substrate that is arranged at an outside of the source region to form a well lead-out region. The well lead-out region is isolated from the source region by an isolation structure.

According to the present disclosure, the manufacturing process of the semiconductor device is provided and includes the following. The semiconductor substrate is provided. The semiconductor substrate includes the drift region in the first conductive type and the well region in the second conductive type. The end of the drift region away from the well region is configured to form the drain region. The end of the well region away from the drift region is configured to form the source region. The gate oxide layer is formed on the semiconductor substrate. The field plate is formed on the gate oxide layer, the ion doping process is performed on at least a portion of the field plate, allowing the portion of the field plate projected onto the drift region includes at least two field-plate regions having different doping concentrations. In this way, while the device is operating, in the direction from the end of the drift region near the well region approaching the drain region, the equivalent electrical thickness of the insulating layer between the field plate and the drift region for forming the field plate capacitor gradually increases. While performing the ion doping process on the portion of the field plate projected on the drift region, the end of the drift region away from the well region may be doped simultaneously to form the drain region, and the end of the well region away from the drift region may be doped to form the source region, such that the performance of the semiconductor device may be improved.

The above description shows only embodiments of the present disclosure and does not limit the scope of the present disclosure. Any equivalent structure or equivalent process transformation performed based on the specification and the accompanying drawings of the present disclosure, applied directly or indirectly in other related fields, shall be equally covered by the scope of the present disclosure.

What is claimed is:

1. A semiconductor device, comprising:
   a semiconductor substrate, comprising a drift region in a first conductivity type and a well region in a second conductivity type, wherein an end of the drift region away from the well region is arranged with a drain region, and an end of the well region away from the drift region is arranged with a source region;
   a gate oxide layer, arranged on the semiconductor substrate and disposed between the source region and the drain region; and
   a polysilicon field plate, arranged on the gate oxide layer, wherein at least a portion of the polysilicon field plate is projected onto the drift region, and the portion of the polysilicon field plate that is projected onto the drift region comprises at least two field-plate regions having different doping concentrations; in a direction from an end of the drift region near the well region approaching the drain region, the doping concentrations of the portion of the polysilicon field plate projected onto the drift region gradually decrease; and
   while the semiconductor device is operating, in the direction from the end of the drift region near the well region approaching the drain region, an equivalent electrical thickness of an insulating layer between the portion of the polysilicon field plate projected onto the drift region and the drift region for forming a field plate capacitor gradually increases.

2. The semiconductor device according to claim 1, wherein,
   the gate oxide layer is a flat oxide layer;
   in the direction from the end of the drift region near the well region approaching the drain region, a doping concentration of one of the at least two field-plate regions disposed near the end of the drift region near the well region is greater than a doping concentration of another one of the at least two field-plate regions disposed near the drain region; a first depletion region is formed by the one of the at least two field-plate regions, a second depletion region is formed by the another one of the at least two field-plate regions; the insulating layer comprises a first insulating layer of the first depletion region and a second insulating layer of the second depletion region; and while the semiconductor device is operating, an equivalent electrical thickness of the first insulation layer of the first depletion region is less than an equivalent electrical thickness of the second insulation layer of the second depletion region; or
   a depletion region is formed by the portion of the polysilicon field plate projected onto the drift region, and the insulating layer comprises a depletion-region insulating layer; and while the semiconductor device is operating, the equivalent electrical thickness of the depletion-region insulation layer increases.

3. The semiconductor device according to claim 2, wherein,
   another portion of the polysilicon field plate that is not projected onto the drift region is a doped field-plate region;
   the at least two field-plate regions in the portion of the polysilicon field plate projected onto the drift region comprises a doped field-plate region and a non-doped field-plate region,
   a doping concentration of the doped field-plate region in the portion of the polysilicon field plate projected onto the drift region is equal to a doping concentration of the doped field-plate region in the another portion of the polysilicon field plate that is not projected onto the drift region; and
   with respect to the non-doped field-plate region, the doped field-plate region in the portion of the polysilicon field plate projected onto the drift region is disposed closer to the another portion of polysilicon field plate that is not projected onto the drift region.

4. The semiconductor device according to claim 1, wherein, the gate oxide layer is a step-shaped oxide layer and comprises at least a first gate oxide layer region in a first thickness and a second gate oxide layer region in a second thickness, the second thickness is greater than the first thickness;
   the polysilicon field plate comprises a first polysilicon field plate disposed on the first gate oxide layer region and a second polysilicon field plate disposed on the second gate oxide layer region, a portion of the first polysilicon field plate is projected onto the drift region, and the second polysilicon field plate is projected onto the drift region;
   at least one of the portion of the first polysilicon field plate projected onto the drift region and the second polysilicon field plate comprises at least two field-plate regions having different doping concentrations, and
   in the direction from the end of the drift region near the well region approaching the drain region, for the portion of the first polysilicon field plate projected onto the drift region, a doping concentration of one of the at least two field-plate regions disposed near the end of the drift region near the well region is greater than a doping concentration of another one of the at least two field-plate regions disposed near the drain region, and/ or for the second polysilicon field plate, a doping concentration of one of the at least two field-plate regions disposed near the end of the drift region near the well region is greater than a doping concentration of another one of the at least two field-plate regions disposed near the drain region; or in the direction from the end of the drift region near the well region approaching the drain region, at least one of the doping concentration of the portion of the first polysilicon field plate projected onto the drift region and the doping concentration of the second polysilicon field plate decreases.

5. The semiconductor device according to claim 4, wherein, the portion of the first polysilicon field plate projected onto the drift region comprises the at least two field-plate regions having different doping concentrations, the at least two field-plate regions comprise a first doped field-plate region and a first non-doped field-plate region; with respect to the first doped field-plate region, the first non-doped field-plate region is disposed closer to the second gate oxide region;

the second polysilicon field plate comprises a second doped field-plate region;

a first depletion region is formed in the first non-doped field-plate region, a second depletion region is formed in the second doped field-plate region; the insulating layer comprises a first insulating layer of the first depletion region and a second insulating layer of the second depletion region; and while the semiconductor device is operating, a sum of an equivalent electrical thickness of the first insulation layer of the first depletion region and an equivalent electrical thickness of the first gate oxide region is less than a sum of an equivalent electrical thickness of the second insulation layer of the second depletion region and an equivalent electrical thickness of the second gate oxide region.

6. The semiconductor device according to claim 4, wherein, the portion of the first polysilicon field plate projected onto the drift region comprises the at least two field-plate regions having doping concentrations, the at least two field-plate regions comprise a first doped field-plate region and a first non-doped field-plate region; and with respect to the first doped field-plate region, the first non-doped field-plate region is disposed closer to the second gate oxide region;

the second polysilicon field plate comprises a second non-doped field-plate region;

a first depletion region is formed in the first non-doped field-plate region, a second depletion region is formed in the second non-doped field-plate region; the insulating layer comprises a first insulating layer of the first depletion region and a second insulating layer of the second depletion region; and while the semiconductor device is operating, a sum of an equivalent electrical thickness of the first insulation layer of the first depletion region and an equivalent electrical thickness of the first gate oxide region is less than a sum of an equivalent electrical thickness of the second insulation layer of the second depletion region and an equivalent electrical thickness of the second gate oxide region.

7. The semiconductor device according to claim 4, wherein, the portion of the first polysilicon field plate projected onto the drift region comprises a first doped field-plate region;

the second polysilicon field plate comprises the at least two field-plate regions having different doping concentrations, the at least two field-plate regions comprise a second doped field-plate region and a second non-doped field-plate region; and with respect to the second doped field-plate region, the second non-doped field-plate region is disposed away from the first gate oxide region; and a first depletion region is formed in the first doped field-plate region, a second depletion region is formed in the second doped field-plate region; the insulating layer comprises a first insulating layer of the first depletion region and a second insulating layer of the second depletion region; and while the semiconductor device is operating, a sum of an equivalent electrical thickness of the first insulation layer of the first depletion region and an equivalent electrical thickness of the first gate oxide region is less than a sum of an equivalent electrical thickness of the second insulation layer of the second depletion region and an equivalent electrical thickness of the second gate oxide region.

8. The semiconductor device according to claim 4, wherein, the portion of the first polysilicon field plate projected onto the drift region comprises the at least two field-plate regions having different doping concentrations, the at least two field-plate regions comprise a first doped field-plate region and a first non-doped field-plate region; and with respect to the first doped field-plate region, the first non-doped field-plate region is disposed closer to the second gate oxide region;

the second polysilicon field plate comprises the at least two field-plate regions having different doping concentrations, the at least two field-plate regions comprise a second doped field-plate region and a second non-doped field-plate region; and with respect to the second doped field-plate region, the second non-doped field-plate region is disposed away from the first gate oxide region;

a first depletion region is formed in the first non-doped field-plate region, a second depletion region is formed in the second doped field-plate region; the insulating layer comprises a first insulating layer of the first depletion region and a second insulating layer of the second depletion region; and while the semiconductor device is operating, a sum of an equivalent electrical thickness of the first insulation layer of the first depletion region and an equivalent electrical thickness of the first gate oxide region is less than a sum of an equivalent electrical thickness of the second insulation layer of the second depletion region and an equivalent electrical thickness of the second gate oxide region.

9. The semiconductor device according to claim 5, wherein, a side of the first non-doped field-plate region near the drain region is aligned with a junction between the first polysilicon field plate and the second polysilicon field plate, and/or the first non-doped field-plate region is disposed at an end position of the second polysilicon field plate near the drain region.

10. The semiconductor device according to claim 4, wherein, the portion of the first polysilicon field plate projected onto the drift region has a last field-plate region disposed near the second gate oxide region, and the second polysilicon field plate has a first field-plate region disposed near the first gate oxide region;

a last depletion region is formed in the last field-plate region, a first depletion region is formed in the first field-plate region; the insulating layer comprises a last insulating layer of the last depletion region and a first insulating layer of the first depletion region; while the semiconductor device is operating, a sum of an equivalent electrical thickness of the last insulation layer of the last depletion region and an equivalent electrical thickness of the first gate oxide region is less than a sum of an equivalent electrical thickness of the first insulation layer of the first depletion region and an equivalent electrical thickness of the second gate oxide region.

11. The semiconductor device according to claim 4, wherein,
the step-shaped gate oxide layer is a multi-step-shaped gate oxide layer and further comprises at least a third gate oxide layer region of a third thickness, the third thickness is greater than the second thickness;
the polysilicon field plate further comprises a third polysilicon field plate disposed on the third gate oxide region, the third polysilicon field plate is projected onto the drift region, and at least one of the portion of the first polysilicon field plate projected onto the drift region, the second polysilicon field plate, and the third polysilicon field plate comprises at least two field-plate regions having different doping concentrations;
in the direction from the end of the drift region near the well region approaching the drain region, for the portion of the first polysilicon field plate projected onto the drift region, the doping concentration of one of the at least two field-plate regions disposed near the end of the drift region near the well region is greater than the doping concentration of another one of the at least two field-plate regions disposed near the drain region; and/or for the second polysilicon field plate, the doping concentration of one of the at least two field-plate regions disposed near the end of the drift region near the well region is greater than the doping concentration of another one of the at least two field-plate regions disposed near the drain region; and/or for the third polysilicon field plate, the doping concentration of one of the at least two field-plate regions disposed near the end of the drift region near the well region is greater than the doping concentration of another one of the at least two field-plate regions disposed near the drain region; or
in the direction from the end of the drift region near the well region approaching the drain region, at least one of the doping concentration of the portion of the first polysilicon field plate projected onto the drift region, and the doping concentration of the second polysilicon field plate, and a doping concentration of the third polysilicon field plate decreases.

12. A manufacturing process of a semiconductor device, comprising:
providing a semiconductor substrate, wherein the semiconductor substrate includes a drift region in a first conductive type and a well region in a second conductive type, an end of the drift region away from the well region is configured to form a drain region, and an end of the well region away from the drift region is configured to form a source region;
forming a gate oxide layer on the semiconductor substrate; and
forming a polysilicon field plate on the gate oxide layer, and performing an ion doping process on at least a portion of the polysilicon field plate to allow the portion of the polysilicon field plate projected onto the drift region to comprise at least two field-plate regions having different doping concentrations; in a direction from an end of the drift region near the well region approaching the drain region, the doping concentrations of the portion of the polysilicon field plate projected onto the drift region gradually decrease;
wherein, while the semiconductor device is operating, in the direction from the end of the drift region near the well region approaching the drain region, an equivalent electrical thickness of an insulating layer between the portion of the polysilicon field plate projected onto the drift region and the drift region for forming a field plate capacitor gradually increases.

13. The manufacturing process according to claim 12, wherein the gate oxide layer is a flat oxide layer;
in the direction from the end of the drift region near the well region approaching the drain region, a doping concentration of one of the at least two field-plate regions disposed near the end of the drift region near the well region is greater than a doping concentration of another one of the at least two field-plate regions disposed near the drain region; a first depletion region is formed by the one of the at least two field-plate regions, a second depletion region is formed by the another one of the at least two field-plate regions; the insulating layer comprises a first insulating layer of the first depletion region and a second insulating layer of the second depletion region; and while the semiconductor device is operating, an equivalent electrical thickness of the first insulation layer of the first depletion region is less than an equivalent electrical thickness of the second insulation layer of the second depletion region; or
a depletion region is formed by the portion of the polysilicon field plate projected onto the drift region, and the insulating layer comprises a depletion-region insulating layer; and while the semiconductor device is operating, the equivalent electrical thickness of the depletion-region insulation layer increases.

14. The manufacturing process according to claim 13, wherein,
another portion of the polysilicon field plate that is not projected onto the drift region is a doped field-plate region;
the at least two field-plate regions in the portion of the polysilicon field plate projected onto the drift region comprises a doped field-plate region and a non-doped field-plate region,
a doping concentration of the doped field-plate region in the portion of the polysilicon field plate projected onto the drift region is equal to a doping concentration of the doped field-plate region in the another portion of the polysilicon field plate that is not projected onto the drift region; and
with respect to the non-doped field-plate region, the doped field-plate region in the portion of the polysilicon field plate projected onto the drift region is disposed closer to the another portion of polysilicon field plate that is not projected onto the drift region.

15. The manufacturing process according to claim 12, wherein, the gate oxide layer is a step-shaped oxide layer and comprises at least a first gate oxide layer region in a first thickness and a second gate oxide layer region in a second thickness, the second thickness is greater than the first thickness;

the polysilicon field plate comprises a first polysilicon field plate disposed on the first gate oxide layer region and a second polysilicon field plate disposed on the second gate oxide layer region, a portion of the first polysilicon field plate is projected onto the drift region, and the second polysilicon field plate is projected onto the drift region;

at least one of the portion of the first polysilicon field plate projected onto the drift region and the second polysilicon field plate comprises at least two field-plate regions having different doping concentrations, and in the direction from the end of the drift region near the well region approaching the drain region, for the portion of the first polysilicon field plate projected onto the drift region, a doping concentration of one of the at least two field-plate regions disposed near the end of the drift region near the well region is greater than a doping concentration of another one of the at least two field-plate regions disposed near the drain region, and/ or for the second polysilicon field plate, a doping concentration of one of the at least two field-plate regions disposed near the end of the drift region near the well region is greater than a doping concentration of another one of the at least two field-plate regions disposed near the drain region; or in the direction from the end of the drift region near the well region approaching the drain region, at least one of the doping concentration of the portion of the first polysilicon field plate projected onto the drift region and the doping concentration of the second polysilicon field plate decreases.

16. The manufacturing process according to claim 15, wherein, the portion of the first polysilicon field plate projected onto the drift region comprises the at least two field-plate regions having different doping concentrations, the at least two field-plate regions comprise a first doped field-plate region and a first non-doped field-plate region; with respect to the first doped field-plate region, the first non-doped field-plate region is disposed closer to the second gate oxide region;

the second polysilicon field plate comprises a second doped field-plate region;

a first depletion region is formed in the first non-doped field-plate region, a second depletion region is formed in the second doped field-plate region; the insulating layer comprises a first insulating layer of the first depletion region and a second insulating layer of the second depletion region; and while the semiconductor device is operating, a sum of an equivalent electrical thickness of the first insulation layer of the first depletion region and an equivalent electrical thickness of the first gate oxide region is less than a sum of an equivalent electrical thickness of the second insulation layer of the second depletion region and an equivalent electrical thickness of the second gate oxide region.

17. The manufacturing process according to claim 15, wherein, the portion of the first polysilicon field plate projected onto the drift region comprises the at least two field-plate regions having doping concentrations, the at least two field-plate regions comprise a first doped field-plate region and a first non-doped field-plate region; and with respect to the first doped field-plate region, the first non-doped field-plate region is disposed closer to the second gate oxide region;

the second polysilicon field plate comprises a second non-doped field-plate region;

a first depletion region is formed in the first non-doped field-plate region, a second depletion region is formed in the second non-doped field-plate region; the insulating layer comprises a first insulating layer of the first depletion region and a second insulating layer of the second depletion region; and while the semiconductor device is operating, a sum of an equivalent electrical thickness of the first insulation layer of the first depletion region and an equivalent electrical thickness of the first gate oxide region is less than a sum of an equivalent electrical thickness of the second insulation layer of the second depletion region and an equivalent electrical thickness of the second gate oxide region.

18. The manufacturing process according to claim 15, wherein, the portion of the first polysilicon field plate projected onto the drift region comprises a first doped field-plate region;

the second polysilicon field plate comprises the at least two field-plate regions having different doping concentrations, the at least two field-plate regions comprise a second doped field-plate region and a second non-doped field-plate region; and with respect to the second doped field-plate region, the second non-doped field-plate region is disposed away from the first gate oxide region; and a first depletion region is formed in the first doped field-plate region, a second depletion region is formed in the second doped field-plate region; the insulating layer comprises a first insulating layer of the first depletion region and a second insulating layer of the second depletion region; and while the semiconductor device is operating, a sum of an equivalent electrical thickness of the first insulation layer of the first depletion region and an equivalent electrical thickness of the first gate oxide region is less than a sum of an equivalent electrical thickness of the second insulation layer of the second depletion region and an equivalent electrical thickness of the second gate oxide region.

19. The manufacturing process according to claim 15, wherein, the portion of the first polysilicon field plate projected onto the drift region comprises the at least two field-plate regions having different doping concentrations, the at least two field-plate regions comprise a first doped field-plate region and a first non-doped field-plate region; and with respect to the first doped field-plate region, the first non-doped field-plate region is disposed closer to the second gate oxide region;

the second polysilicon field plate comprises the at least two field-plate regions having different doping concentrations, the at least two field-plate regions comprise a second doped field-plate region and a second non-doped field-plate region; and with respect to the second doped field-plate region, the second non-doped field-plate region is disposed away from the first gate oxide region;

a first depletion region is formed in the first non-doped field-plate region, a second depletion region is formed in the second doped field-plate region; the insulating layer comprises a first insulating layer of the first depletion region and a second insulating layer of the second depletion region; and while the semiconductor device is operating, a sum of an equivalent electrical thickness of the first insulation layer of the first depletion region and an equivalent electrical thickness of the first gate oxide region is less than a sum of an equivalent electrical thickness of the second insulation layer of the second depletion region and an equivalent electrical thickness of the second gate oxide region.

20. The manufacturing process according to claim 15, wherein, the portion of the first polysilicon field plate projected onto the drift region has a last field-plate region disposed near the second gate oxide region, and the second polysilicon field plate has a field-plate gate region disposed near the first gate oxide region;

a last depletion region is formed in the last field-plate region, a first depletion region is formed in the first field-plate region; the insulating layer comprises a last insulating layer of the last depletion region and a first insulating layer of the first depletion region; and while the semiconductor device is operating, a sum of an equivalent electrical thickness of the last insulation layer of the last depletion region and an equivalent electrical thickness of the first gate oxide region is less than a sum of an equivalent electrical thickness of the first insulation layer of the first depletion region and an equivalent electrical thickness of the second gate oxide region.

* * * * *